(12) United States Patent
Duan

(10) Patent No.: US 12,478,797 B2
(45) Date of Patent: Nov. 25, 2025

(54) PORTABLE HAIR-REMOVAL APPARATUS

(71) Applicant: Shenzhen Yangwo Electronic Co., Ltd., Shenzhen (CN)

(72) Inventor: Dejin Duan, Shenzhen (CN)

(73) Assignee: SHENZHEN YANGWO ELECTRONIC CO., LTD., Shenzhen (CN)

( * ) Notice: Subject to any disclaimer, the term of this patent is extended or adjusted under 35 U.S.C. 154(b) by 376 days.

(21) Appl. No.: 18/161,104

(22) Filed: Jan. 30, 2023

(65) Prior Publication Data

US 2023/0173298 A1   Jun. 8, 2023

Related U.S. Application Data

(63) Continuation of application No. PCT/CN2020/133887, filed on Dec. 4, 2020.

(30) Foreign Application Priority Data

Jul. 30, 2020  (CN) .......................... 202021558992.7
Jul. 30, 2020  (CN) .......................... 202021559473.2
Jul. 30, 2020  (CN) .......................... 202021575714.2

(51) Int. Cl.
*A61N 5/06* (2006.01)
*H05K 7/20* (2006.01)

(52) U.S. Cl.
CPC ....... *A61N 5/0617* (2013.01); *H05K 7/20145* (2013.01); *H05K 7/20154* (2013.01)

(58) Field of Classification Search
None
See application file for complete search history.

(56) References Cited

U.S. PATENT DOCUMENTS 5,001,608 A * 3/1991 Kehrli ................... A45D 20/12
362/264
2005/0177139 A1   8/2005 Yamazaki et al.
(Continued)

FOREIGN PATENT DOCUMENTS

CN          207980186 U       10/2018
CN          209572304 U       11/2019
(Continued)

OTHER PUBLICATIONS

Definition of "clamp" and "clamped", The American Heritage® Dictionary of the English Language (Year: 2016).*

*Primary Examiner* — Carl H Layno
*Assistant Examiner* — Manolis Pahakis
(74) *Attorney, Agent, or Firm* — Andrew C. Cheng

(57) ABSTRACT

A portable hair-removal apparatus (1) is provided, which includes an air-suction mechanism (10). The air-suction mechanism (10) includes a heat-generating assembly (101) and a heat-dissipation housing (102). The heat-dissipation housing (102) is provided with an air outlet (1021). The heat-generating assembly (101) is connected to the heat-dissipation housing (102) and defines at least one air inlet (1022). External air is sucked into the heat-dissipation housing (102) via the air inlet (1022), flows through the heat-generating assembly (101) to reduce the temperature thereof, and is discharged via the air outlet (1021). A short-range air-passing channel is formed by means of the cooperation of multiple components, such that the heat dissipation performance is improved, the size is further reduced by simplifying the internal structure and the portability is improved.

15 Claims, 8 Drawing Sheets

(56) References Cited

U.S. PATENT DOCUMENTS

| | | | | |
|---|---|---|---|---|
| 2011/0166559 A1* | 7/2011 | Eckhouse | | A45D 26/00 |
| | | | | 606/9 |
| 2011/0270365 A1* | 11/2011 | Hamada | | A61N 5/0617 |
| | | | | 607/90 |
| 2012/0197357 A1* | 8/2012 | Dewey | | A61N 5/0616 |
| | | | | 607/89 |
| 2013/0060309 A1* | 3/2013 | Bradley | | A61B 18/18 |
| | | | | 607/100 |
| 2013/0340260 A1* | 12/2013 | Sueyoshi | | A45D 26/0057 |
| | | | | 30/123 |
| 2015/0209108 A1* | 7/2015 | Kim | | A61B 18/203 |
| | | | | 606/9 |
| 2015/0282878 A1* | 10/2015 | Kindermann | | A61B 18/18 |
| | | | | 606/9 |
| 2016/0106506 A1* | 4/2016 | Eckhouse | | A61B 18/203 |
| | | | | 606/9 |

FOREIGN PATENT DOCUMENTS

| | | | | |
|---|---|---|---|---|
| CN | 209790005 U | | 12/2019 | |
| CN | 211097091 U | | 7/2020 | |
| CN | 111973884 A | | 11/2020 | |
| GB | 2553575 A | * | 3/2018 | ............. A61B 18/18 |
| JP | 3226132 U | * | 4/2020 | ............. A45D 26/00 |
| WO | WO-2012011009 A1 | * | 1/2012 | ........... A61N 5/0616 |

* cited by examiner

PORTABLE HAIR-REMOVAL APPARATUS

CROSS-REFERENCE TO RELATED APPLICATIONS

This application claims priority to Chinese Patent Applications No. 202021558992.7, No. 202021575714.2 and No. 202021559473.2, disclosures of which are hereby incorporated by reference in their entireties.

TECHNICAL FIELD

The present disclosure relates to the technical field of hair-removal devices, and in particular, to a portable hair-removal apparatus.

BACKGROUND

Hair-removal devices are comfortable, safe and fashionable household apparatuses that adopt advanced optical hair removal to effectively prevent the regrowth of hair on various parts of the body and remove hair permanently.

In the existing art, a heat dissipation mechanism and an air duct for blowing and heat dissipation are usually provided in the hair-removal apparatus, but the traditional heat dissipation mechanism is complex in structure and high in manufacturing cost. Moreover, the length of the air duct of the traditional heat dissipation mechanism is too long, resulting in the hair-removal apparatus being inconvenient to carry due to too large volume thereof, and low heat dissipation efficiency due to the length of the air duct being too long.

In order to solve the above-mentioned problems, it is urgent to provide a new portable hair-removal apparatus.

SUMMARY

In view of the problems that in the existing art, the length of an air duct of a traditional hair-removal apparatus is too long, resulting in the size of the hair-removal apparatus being large and inconvenient to carry and the heat dissipation efficiency being low, a portable hair-removal apparatus is provided.

The portable hair-removal apparatus includes an air-suction mechanism. The air-suction mechanism includes a heat-generating assembly and a heat-dissipation housing. The heat-dissipation housing is provided with an air outlet. The heat-generating assembly is connected to the heat-dissipation housing and defines at least one air inlet. External air is sucked into the heat-dissipation housing via the air inlet, flows through the heat-generating assembly to reduce the temperature of the heat-generating assembly and is discharged from the air outlet.

Preferably, the number of the air inlets is at least two, and the two air inlets are located at two opposite ends of the heat-generating assembly.

Preferably, a gap is reserved between two ends of the heat-generating assembly and a side wall of the heat-dissipation housing to define the air inlet.

Preferably, the portable hair-removal apparatus does not include a refrigeration assembly for refrigeration and for the fit of the skin of a user.

Preferably, the air outlet is disposed on the middle position of the side of the heat-dissipation housing away from the heat-generating assembly. The heat-dissipation housing and the heat-generating assembly jointly define an air-passing cavity. External air sucked from the air inlet flows in the air-passing cavity to take away heat of the heat-generating assembly and is discharged via the air outlet.

Preferably, the portable hair-removal apparatus further includes a housing and a heat-dissipation cover. The air-suction mechanism includes a light-filter head housing. The housing is connected to the heat-dissipation housing, and the heat-dissipation cover is clamped with the light-filter head housing. An annular air-entrance gap is formed between the heat-dissipation cover and the housing. The air-entrance gap is communicated with the air-passing cavity via the air inlet, and external air is sucked into the air-passing cavity through the air-entrance gap and the air inlet sequentially.

Preferably, the portable hair-removal apparatus further includes a housing and a heat-dissipation cover. The housing is connected to the heat-dissipation housing, and the heat-dissipation cover and the housing are integrally formed. An air-inlet through hole is formed on the heat-dissipation cover and/or on the housing. The air-inlet through hole communicates with the air-passing cavity via the air inlet, and external air is sucked into the air-passing cavity via the air-inlet through hole and the air inlet sequentially.

Preferably, the light-filter head assembly includes a light-filter head, a light-filter lens and an annular light-shield sheet made of polytetrafluoroethylene. The light-filter head is disposed in the light-filter head housing. The light-filter lens is compactly attached to the light-filter head. The light-shield sheet is disposed between the light-filter lens and the heat-generating assembly.

Preferably, the portable hair-removal apparatus further includes a fan assembly. The housing is provided with an air-exhaust opening. The fan assembly includes an air-suction opening and an air-supply opening. The air-suction opening is communicated with the air outlet, and the air-supply opening is communicated with the air-exhaust opening.

Preferably, the fan assembly is disposed directly opposite to the heat-generating assembly.

Preferably, the portable hair-removal apparatus further includes a circuit-board assembly and an inner support. The inner support is provided with a fan through hole, and the fan assembly is disposed in the fan through hole. The circuit-board assembly is disposed on the inner support and is provided with a limiting hole at the fan through hole. One end of the air-suction mechanism provided with the air outlet passes through the limiting hole and is docked with the fan through hole to communicate with the fan assembly.

Preferably, the portable hair-removal apparatus further includes an aluminum capacitor and a key assembly electrically connected to the circuit-board assembly. The circuit-board assembly is electrically connected to the aluminum capacitor and the circuit-board assembly and the aluminum capacitor are disposed on two opposite sides of the inner support. The inner support is provided with a limiting mechanism, and the key assembly is located in the limiting mechanism.

Preferably, the heat-generating assembly includes a lamp tube and a reflective cup, and the lamp tube is disposed in the reflective cup in a penetrating manner.

Preferably, a heat sink is provided corresponding to the reflective cup, and the heat sink is disposed between the reflective cup and the air outlet.

Preferably, the heat sink includes an attaching portion and at least two sheet-shaped protruding portions. The attaching portion is attached to the reflective cup. The sheet-shaped protruding portions are arranged on the attaching portion in a spaced manner and every two of the sheet-shaped protruding portions define an air-passing gap.

Compared with the existing art, the portable hair-removal apparatus of the present disclosure has the following beneficial effects.

A complete short-range air-passing channel by means of sequentially communicating the air-entrance gap q, the air inlet, the air-passing cavity p, the air outlet, the fan assembly and the air-exhaust opening. Compared with traditional hair-removal devices that need an additional air duct, the cost of the portable hair-removal apparatus is lower, the internal structure is simplified, the volume is reduced, and the portability is improved. The portable hair-removal apparatus rotates and sucks air through the fan assembly, such that external air is sucked via the air-entrance gap q. Then the external air enters the air-passing cavity p via the air inlet and flows through the heat-generating assembly to reduce the temperature thereof. At this time, the external air takes away part of the heat of the heat-generating assembly and is discharged via the air outlet. Then the external air is sucked into the fan assembly via the air-suction opening provided on the fan assembly. Finally, the fan assembly blows the external air from the air-supply opening to the air-exhaust opening of the housing, and the external air is discharged from the air-exhaust opening to the ambiance. As such, the heat of the heat-generating assembly in the portable hair-removal apparatus can be discharged timely by means of the air-guiding effect of the air-passing channel and the air-suction effect of the fan assembly. Furthermore, the external air sucked by the air-entrance gap q is blown in the direction of the inner wall of the heat-dissipation cover, such that the heat on the heat-dissipation cover is taken away timely by the continuous airflow. Therefore, the temperature of the heat-dissipation cover tends to be stable and does not overheat, which solves the problem of discomfort caused by the skin of the user being in contact with the overheated heat-dissipation cover and effectively optimizes the hair removal experience. Understandably, the complete short-range air-passing channel in the portable hair-removal apparatus enables the heat in each component inside the portable hair-removal apparatus can be dissipated timely, which further improves the heat dissipation performance thereof, such that the durability and safety of the portable hair-removal apparatus are greatly improved, and the portable hair-removal apparatus is more convenient to use. Additionally, since the heat dissipation performance of the portable hair-removal apparatus is improved, the working temperature of the portable hair-removal apparatus can be reduced, and the user experience will not be affected when using the portable hair-removal apparatus.

The portable hair-removal apparatus is different from traditional hair-removal apparatuses, and is simpler in structure and more exquisite and exquisite in size. Although traditional hair-removal apparatuses alleviate the pain of the skin during hair removal by means of the addition of a refrigeration assembly for cooling and fitting the skin (i.e. the heat conduction pipe and the refrigeration sheet), the manufacturing cost of the hair-removal apparatus is increased and the internal heat of the hair-removal apparatus is increased (heat generated by the heat conduction pipe and the refrigeration sheet will increase the total heat of the interior of the hair-removal apparatus). In contrast, neither a heat conduction pipe nor a refrigeration sheet is provided in the portable hair-removal apparatus of this embodiment, and the air-guiding mechanism for heat dissipation is simple in structure. Understandably, the portable hair-removal apparatus simplifies the structure by not providing an air-guiding pipe and a refrigeration sheet, such that the manufacturing cost is reduced, the heat source in the hair-removal apparatus is reduced, and production and large-scale popularization are facilitated. Further, the portable hair-removal apparatus does not provide a heat pipe and a refrigeration sheet, such that the internal structure is effectively simplified and the internal heat source is reduced, and the size of the portable hair-removal apparatus is further reduced. Due to the shape of the portable hair-removal apparatus being smaller than that of a traditional hair-removal apparatus, the portable hair-removal apparatus can be carried around at any time, and the problem that a traditional hair-removal apparatus is inconvenient to carry due to its overlarge size can be solved.

The air-entrance gap q is defined by the heat-dissipation cover and the housing, and the air-entrance gap q is mainly configured to communicate the air-passing cavity p of the air-suction mechanism with ambiance, such that outside air can be smoothly sucked into the air-passing cavity p to dissipate heat generated by the heat-generating assembly in the air-passing cavity p. The air-entrance gap q for air intake is of a narrow annular gap structure and is not prone to being touched by a user or other objects. Compared with the hole-shaped mechanism for air intake of traditional hair-removal apparatuses, external objects are not prone to entering, which solves the problem that the air-entering mechanism may be blocked by external objects and consequently air intake is not smooth, resulting in heat dissipation of the hair-removal apparatus being affected. The gap-shaped air-entrance gap q is adopted as an air-entering mechanism, without providing an additional hole-shaped air-entering mechanism, such that the portable hair-removal apparatus is more aesthetic and fashionable. Understandably, the above-mentioned shape of the portable hair-removal apparatus is more easily accepted by customers with high requirements, which is convenient to popularize.

The light-shield sheet mainly plays a role in shading light. The light-shield sheet is an annular film made of polytetrafluoroethylene and is provided with a light-transmitting hole. The light-shield sheet itself is not light-transmitting. The annular light-shield sheet is disposed between the heat-generating assembly and the light-filter lens, such that the light emitted by the lamp tube in the heat-generating assembly can only irradiate the light-filter lens through the light-transmitting hole of the light-shield sheet. The irradiation area of the lamp tube is limited, and the situation that the light emitted by the lamp tube is irradiated on other internal components resulting in damage and abnormal work due to overheating of the internal components can be prevented. The light-shield sheet is made of polytetrafluoroethylene, which has the advantages of heat resistance, cold resistance and excellent shading performance, and can be used for a long time in the temperature range of −60° C.-260° C. The service life of the light-shield sheet is increased, and the light-shield sheet can be prevented from being damaged due to long-term use in a high-temperature environment.

The heat-dissipation cover in the portable hair-removal apparatus protrudes out of the housing, and the outer structure of the entire portable hair-removal apparatus except the slightly convex heat-dissipation cover is an elongated rod-shaped structure, such that the portable hair-removal apparatus is more convenient to hold compared with traditional hair-removal apparatuses. A user can select a contact portion between the palm and the portable hair-removal apparatus within a large range, which makes the operation thereof convenient. Since the portable hair-removal apparatus is of an elongated rod-shaped structure, the portable hair-removal apparatus can be placed in a narrow space, and people can conveniently place the portable hair-removal apparatus on a narrow container (such as a bag or a handbag) that they carry with them when going out, which further improves the portability of the portable hair-removal apparatus. The rod-shaped structure enables the overall strength of the portable hair-removal apparatus to be greatly improved, such that the portable hair-removal apparatus is less prone to damage compared with hair-removal apparatuses with other shapes.

Figure 1:
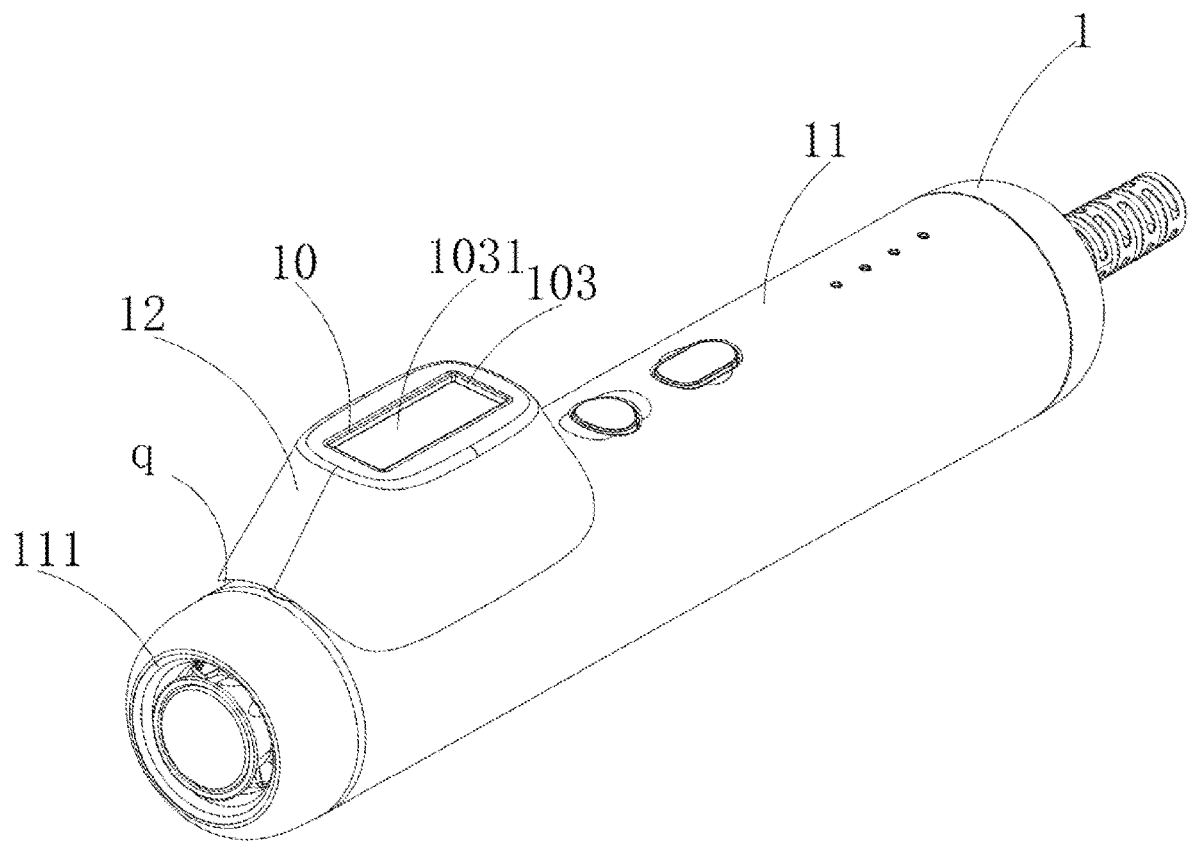
FIG. 1 is a perspective view of an overall structure of a portable hair-removal apparatus according to a first embodiment.

REFERENCE NUMERALS 1, portable hair-removal apparatus;
10, air-suction mechanism; 101, heat-generating assembly; 1011, reflective cup; 1012, lamp tube; 102. heat-dissipation housing; 1021, air outlet; 1022, air inlet; 103, light-filter head assembly; 104. light-filter head housing; 11, housing; 12, heat-dissipation cover; 1031, light-filter head; 1032, light-filter lens; 1033, light-shield sheet; 13, fan assembly; 130, fan housing; 131, air-suction opening; 132, air-supply opening; 111, air-exhaust opening; 14, heat sink; 141, attaching portion; 142, sheet-shaped protruding portion; 133, turbine fan; 15, inner support; 151, fan through hole; 152, air-exhaust pipeline; 153, air-outlet grille; 154, limiting mechanism; 16, key assembly; 17, aluminum capacitor; 18, circuit-board assembly; 181, limiting hole; p, air-passing cavity; q, air-entrance gap.

DETAILED DESCRIPTION

In order to make the objectives, technical solutions, and advantages of the present disclosure clearer, the present disclosure will be further described in detail below with reference to the accompanying drawings and embodiments. It should be understood that the specific disclosures described herein are merely used to explain the present disclosure and are not intended to limit the present disclosure.

Figure 2:
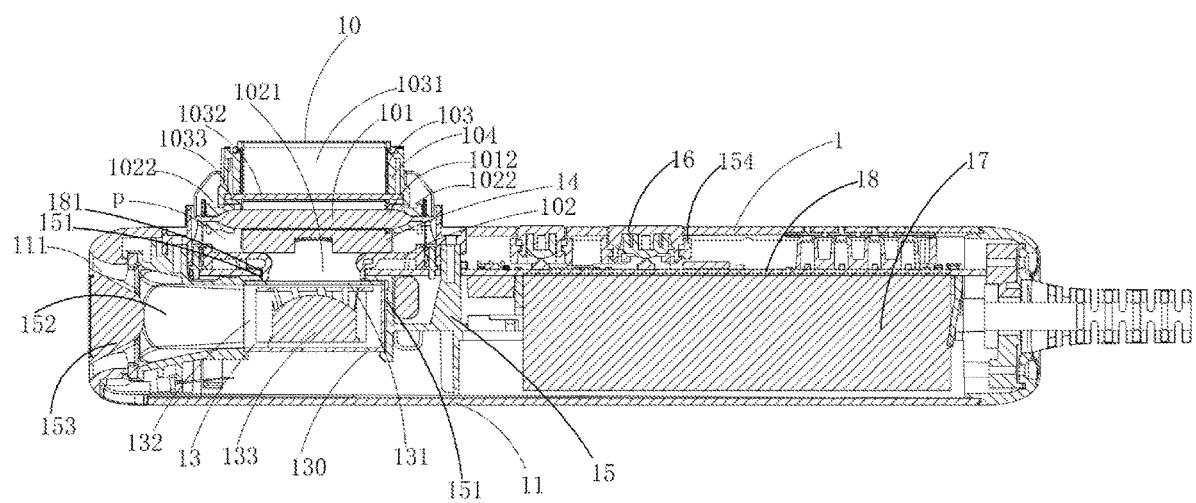
FIG. 2 is a cross-sectional view of the portable hair-removal apparatus according to the first embodiment.

Referring to FIGS. 1-2, a portable hair-removal apparatus 1 is provided. The portable hair-removal apparatus 1 includes an air-suction mechanism 10. The air-suction mechanism 10 includes a heat-generating assembly 101 and a heat-dissipation housing 102. The heat-dissipation housing 102 is provided with an air outlet 1021. The heat-generating assembly 101 is connected to the heat-dissipation housing 102 and defines an air-passing cavity p and at least one air inlet 1022. External air is sucked into the air-passing cavity p via the air inlet 1022 and flows through the heat-generating assembly 101 to reduce the temperature of the heat-generating assembly 101, such that the temperature of the components in contact with the skin around the air-passing cavity p can also be reduced. External air is then discharged via the air outlet 1021.

Optionally, the number of the air inlet 1022 may be two, and the two air inlets 1022 are respectively located at two opposite ends of the heat-generating assembly 101.

The portable hair-removal apparatus 1 further includes a housing 11 and a heat-dissipation cover 12. The housing 11 is connected to the heat-dissipation housing 102. An annular air-entrance gap q is disposed between the heat-dissipation cover 12 and the housing 11, and the air-entrance gap q is communicated with the air-passing cavity p via the air inlet 1022. External air is sequentially sucked into the air-passing cavity p through the air-entrance gap q and the air inlet 1022.

Further, the air-entrance gap q is defined by the heat-dissipation cover 12 and the housing 11, and the air-entrance gap q is mainly configured to communicate the air-passing cavity p of the air-suction mechanism 10 with ambiance, such that outside air can be smoothly sucked into the air-passing cavity p to dissipate heat generated by the heat-generating assembly 101 in the air-passing cavity p. The air-entrance gap q for air intake is of a narrow annular gap structure and is not prone to being touched by a user or other objects. Compared with the hole-shaped mechanism for air intake of traditional hair-removal apparatuses, external objects are not prone to entering, which solves the problem that the air-entering mechanism may be blocked by external objects and consequently air intake is not smooth, resulting in heat dissipation of the hair-removal apparatus being affected. The gap-shaped air-entrance gap q is adopted as an air-entering mechanism, without providing an additional hole-shaped air-entering mechanism, such that the portable hair-removal apparatus 1 is more aesthetic and fashionable. Understandably, the above-mentioned shape of the portable hair-removal apparatus 1 is more easily accepted by customers with high requirements, which is convenient to popularize.

Figure 3:
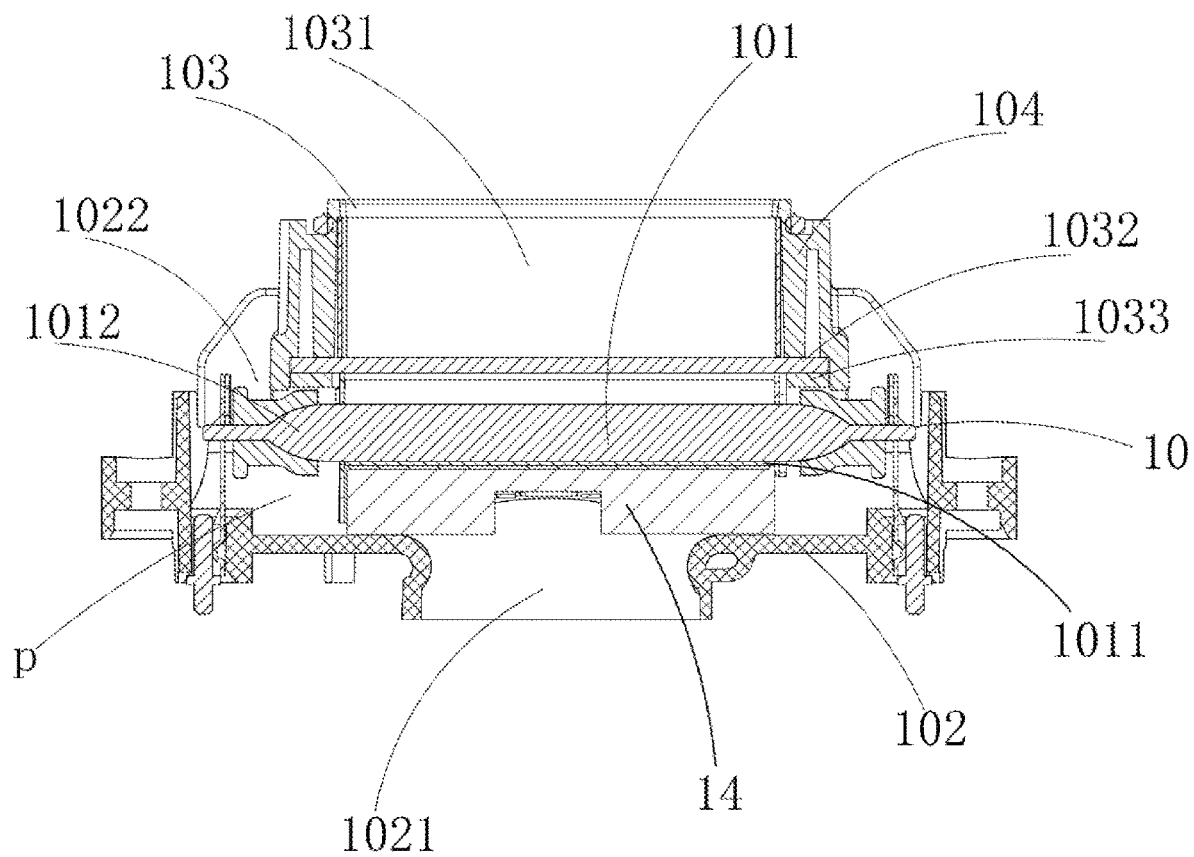
FIG. 3 is a partial cross-sectional view of the portable hair-removal apparatus according to the first embodiment.
Figure 4:
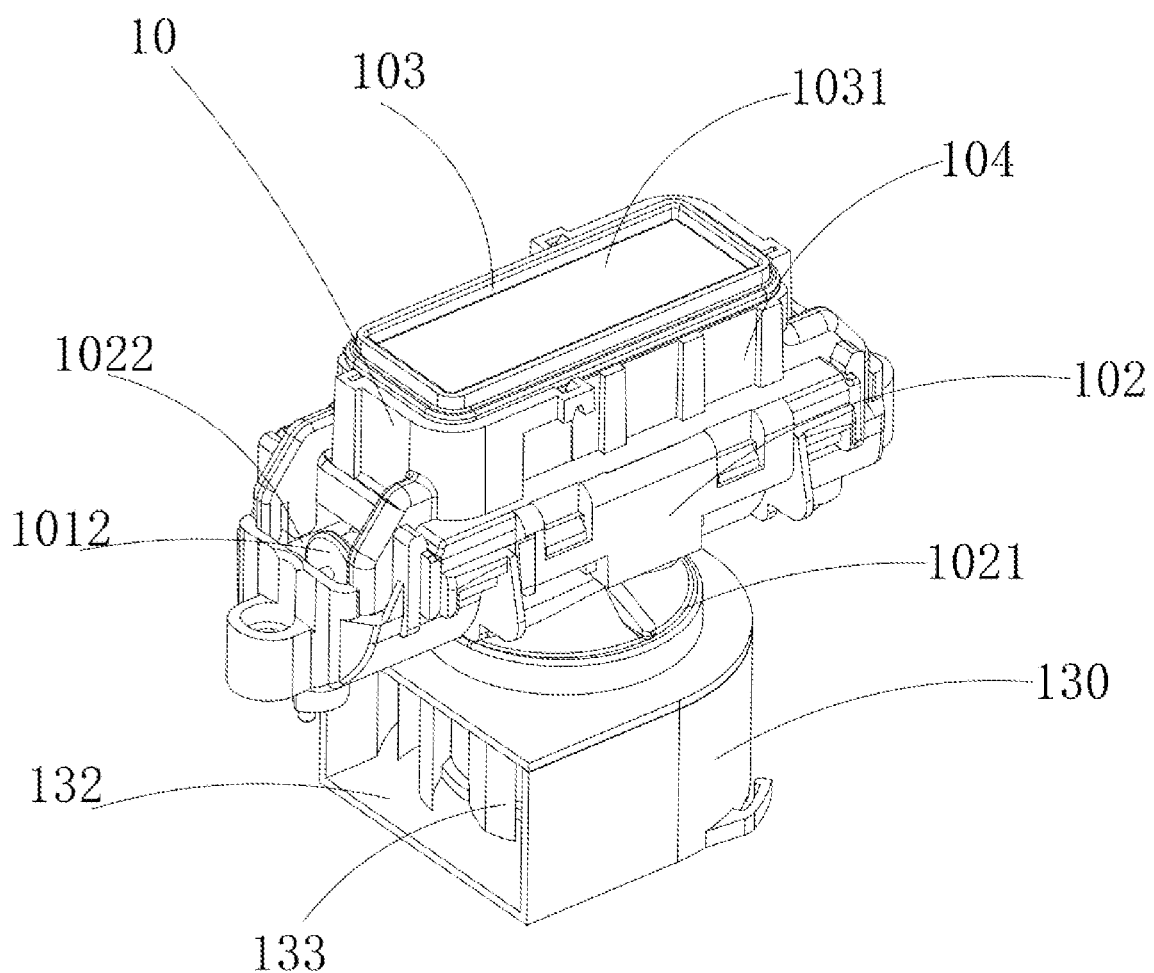
FIG. 4 is a partial perspective view 1 of the portable hair-removal apparatus according to the first embodiment.

Referring to FIGS. 3-4, a gap is reserved between two ends of the heat-generating assembly 101 and the side wall of the heat-dissipation housing 102 to define the air inlet 1022. The air outlet 1021 is disposed on the middle position of the side of the heat-dissipation housing 102 away from the heat-generating assembly 101. The air inlet 1022 is defined by the heat-generating assembly 101 and the heat-dissipation housing 102, such that the heat-dissipation housing 102 does not need to be additionally punched for air intake during manufacturing, thereby reducing manufacturing costs.

The portable hair-removal apparatus 1 further includes a fan assembly 13. The housing 11 is provided with an air-exhaust opening 111. The fan assembly 13 includes an air-suction opening 131 and an air-supply opening 132, and the air-suction opening 131 is in communication with the air outlet 1021. The air-supply opening 132 is disposed directly opposite to the air-exhaust opening 111, such that the air-supply opening 132 can communicate with the air-exhaust opening 111 to form an unblocked air duct. The air-exhaust opening 111 is in communication with the ambiance. External air sucked into the portable hair-removal apparatus 1 is blown out of the air-supply opening 132 of the fan assembly 13 after heat dissipation of the heat-generating assembly 101, and is finally discharged to ambiance via the air-exhaust opening 111.

Figure 5:
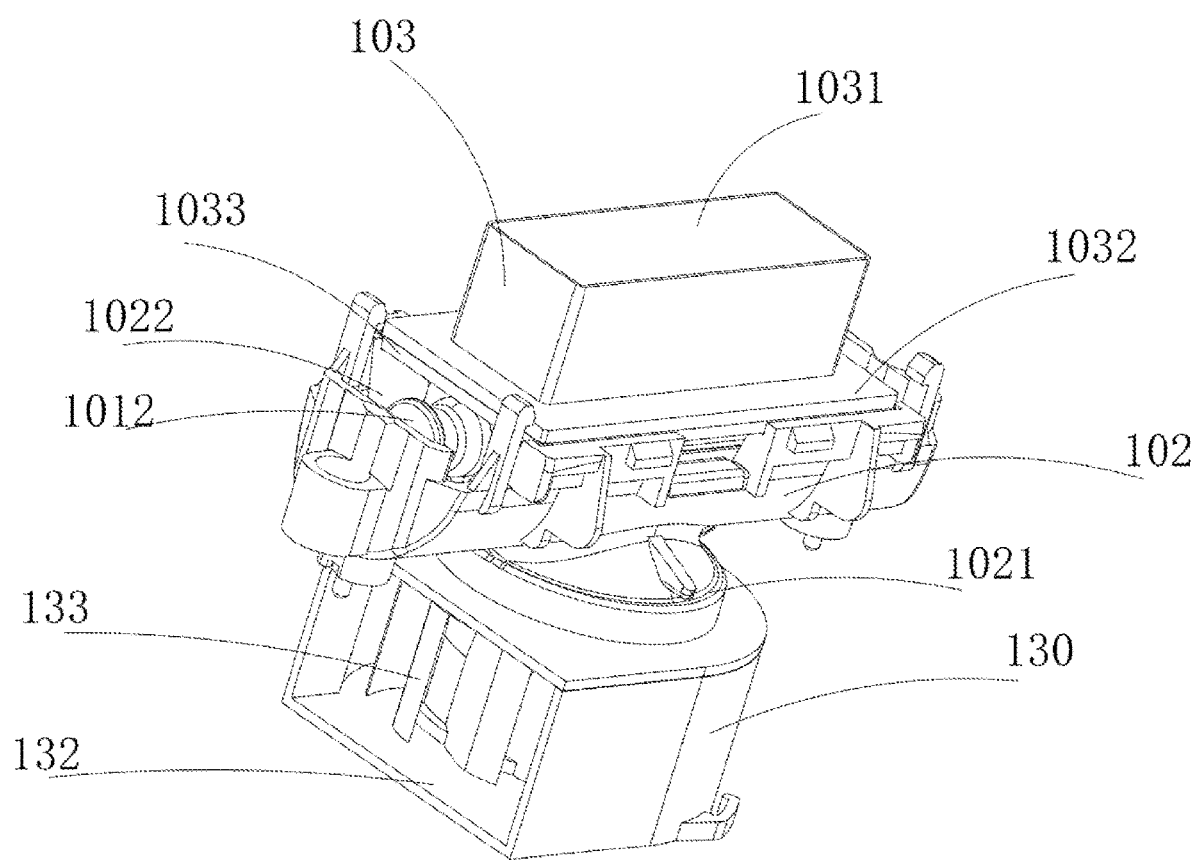
FIG. 5 is a partial perspective view 2 of the portable hair-removal apparatus according to the first embodiment.

Referring to FIGS. 4-5, the portable hair-removal apparatus 1 has no refrigeration sheet. A refrigeration sheet may include a refrigeration surface and a heating surface. The refrigeration surface is used for cooling components in contact with the skin to reduce skin pain. Further, the portable hair-removal apparatus 1 has no heat conduction pipe, which is in contact with the heating surface to dissipate heat thereof.

Further, the portable hair-removal apparatus 1 of the first embodiment is different from traditional hair-removal apparatuses, and is simpler in structure and more exquisite and exquisite in size. Although traditional hair-removal apparatuses alleviate the pain of the skin during hair removal by means of the addition of a refrigeration assembly for cooling and fitting the skin (i.e. the heat conduction pipe and the refrigeration sheet), the manufacturing cost of the hair-removal apparatus is increased and the internal heat of the hair-removal apparatus is increased (heat generated by the heat conduction pipe and the refrigeration sheet will increase the total heat of the interior of the hair-removal apparatus). In contrast, neither a heat conduction pipe nor a refrigeration sheet is provided in the portable hair-removal apparatus 1 of this embodiment, and the air-guiding mechanism for heat dissipation is simple in structure. Understandably, the portable hair-removal apparatus 1 simplifies the structure by not providing an air-guiding pipe and a refrigeration sheet, such that the manufacturing cost is reduced, the heat source in the hair-removal apparatus is reduced, and production and large-scale popularization are facilitated. Further, the portable hair-removal apparatus 1 does not provide a heat pipe and a refrigeration sheet, such that the internal structure is effectively simplified and the internal heat source is reduced, and the size of the portable hair-removal apparatus 1 is further reduced. Due to the shape of the portable hair-removal apparatus 1 being smaller than that of a traditional hair-removal apparatus, the portable hair-removal apparatus 1 can be carried around at any time, and the problem that a traditional hair-removal apparatus is inconvenient to carry due to its overlarge size can be solved.

The air-suction mechanism 10 further includes a light-filter head assembly 103 and a light-filter head housing 104, and the light-filter head assembly 103 is disposed in the light-filter head housing 104. The heat-dissipation cover 12 is clamped with the light-filter head housing 104. The light-filter head housing 104 is engaged with the heat-dissipation housing 102, and the light-filter head assembly 103 is disposed directly opposite to the heat-generating assembly 101.

The light-filter head assembly 103 includes a light-filter head 1031, a light-filter lens 1032 and a light-shield sheet 1033. The light-filter head 1031 is disposed in the light-filter head housing 104. The light-filter lens 1032 is compactly attached to the light-filter head 1031. The light-shield sheet 1033 is disposed between the light-filter lens 1032 and the heat-generating assembly 101.

Further, the light-shield sheet 1033 mainly plays a role in shading light. The light-shield sheet 1033 is an annular film made of polytetrafluoroethylene and is provided with a light-transmitting hole. The light-shield sheet 1033 itself is not light-transmitting. The annular light-shield sheet 1033 is disposed between the heat-generating assembly 101 and the light-filter lens 1032, such that the light emitted by the lamp tube 1012 in the heat-generating assembly 101 can only irradiate the light-filter lens 1032 through the light-transmitting hole of the light-shield sheet 1033. The irradiation area of the lamp tube 1012 is limited, and the situation that the light emitted by the lamp tube 1012 is irradiated on other internal components resulting in damage and abnormal work due to overheating of the internal components can be prevented. The light-shield sheet 1033 is made of polytetrafluoroethylene, which has the advantages of heat resistance, cold resistance and excellent shading performance, and can be used for a long time in the temperature range of −60° C.-260° C. The service life of the light-shield sheet 1033 is increased, and the light-shield sheet 1033 can be prevented from being damaged due to long-term use in a high-temperature environment.

The heat-generating assembly 101 includes a lamp tube 1012 and a reflective cup 1011, and the lamp tube 1012 is disposed in the reflective cup 1011 in a penetrating manner. The reflective cup 1011 is provided with a heat sink 14 disposed between the reflective cup 1011 and the air outlet 1021. The heat sink 14 includes an attaching portion 141 and at least two sheet-shaped protruding portions 142, and the heat sink 14 is of an integrally-formed structure. The attaching portion 141 is attached to the reflective cup 1011. The sheet-shaped protruding portions 142 are arranged on the attaching portion 141 in a spaced manner and each two thereof defines an air-passing gap. The heat sink 14 for accelerating heat dissipation is disposed at the heat-generating assembly 101, such that heat in the heat-generating assembly 101 can be dissipated timely, thereby solving the problem of overheating damage of the heat-generating assembly 101 caused by low heat dissipation efficiency. The attaching portion 141 is adapted to the shape of the reflective cup 1011 of the heat-generating assembly 101, such that the heat sink 14 can be compactly attached to the reflective cup 1011 to maximally absorb heat emitted by the reflective cup 1011. Air-passing gaps formed by the plurality of spaced sheet-shaped protrusions 142 further improve the contact area between the heat sink 14 and air, so as to improve the heat dissipation performance of the heat sink 14. When continuous external air passes through the air-passing gaps, the heat of the heat sink 14 can be taken away timely, such that heat generated by the heat-generating assembly 101 can be dissipated promptly.

Referring to FIG. 5, the fan assembly 13 further includes a turbine fan 133 and a fan housing 130, and the turbine fan 133 is disposed in the fan housing 130. The rotation of the turbine fan 133 provides a power source for the intake of external air. The turbine fan 133 has the advantages of low air loss and high air suction volume, such that the ventilation efficiency of the portable hair-removal apparatus 1 during air suction and heat dissipation is greatly improved, and the heat dissipation performance thereof is further improved.

Figure 6:
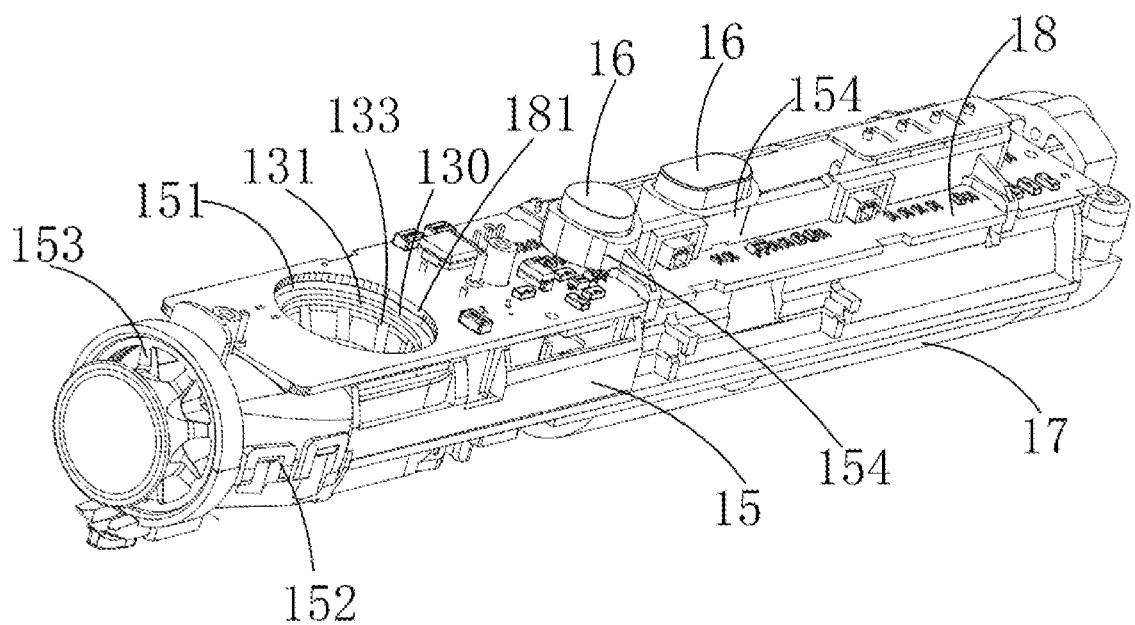
FIG. 6 is a partial perspective view 3 of the portable hair-removal apparatus according to the first embodiment.

Referring to FIG. 6, the portable hair-removal apparatus 1 includes a circuit-board assembly 18, an air-suction mechanism 10 and an inner support 15. The inner support 15 is provided with a fan through hole 151, and the fan assembly 13 is disposed in the fan through hole 151. The circuit-board assembly 18 is disposed on the inner support 15 and provided with a limiting hole 181 at the fan through hole 151. One end of the air-suction mechanism 10 provided with the air outlet 1021 passes through the limiting hole 181 and is docked with the fan through hole 151 to communicate with the fan assembly 13. By integrating the fan assembly 13 and other components and the inner support 15 into a whole, the occupied space of the internal mechanism of the portable hair-removal apparatus 1 can be reduced, that is, the internal structure thereof can be optimized, such that the size of the portable hair-removal apparatus 1 is further reduced, and the portable hair-removal apparatus 1 is more convenient to carry compared with traditional hair-removal apparatuses. Understandably, this design enables the internal structure of the portable hair-removal apparatus 1 to be more compact, thereby improving the stability thereof as well as the portability thereof.

Figure 7:
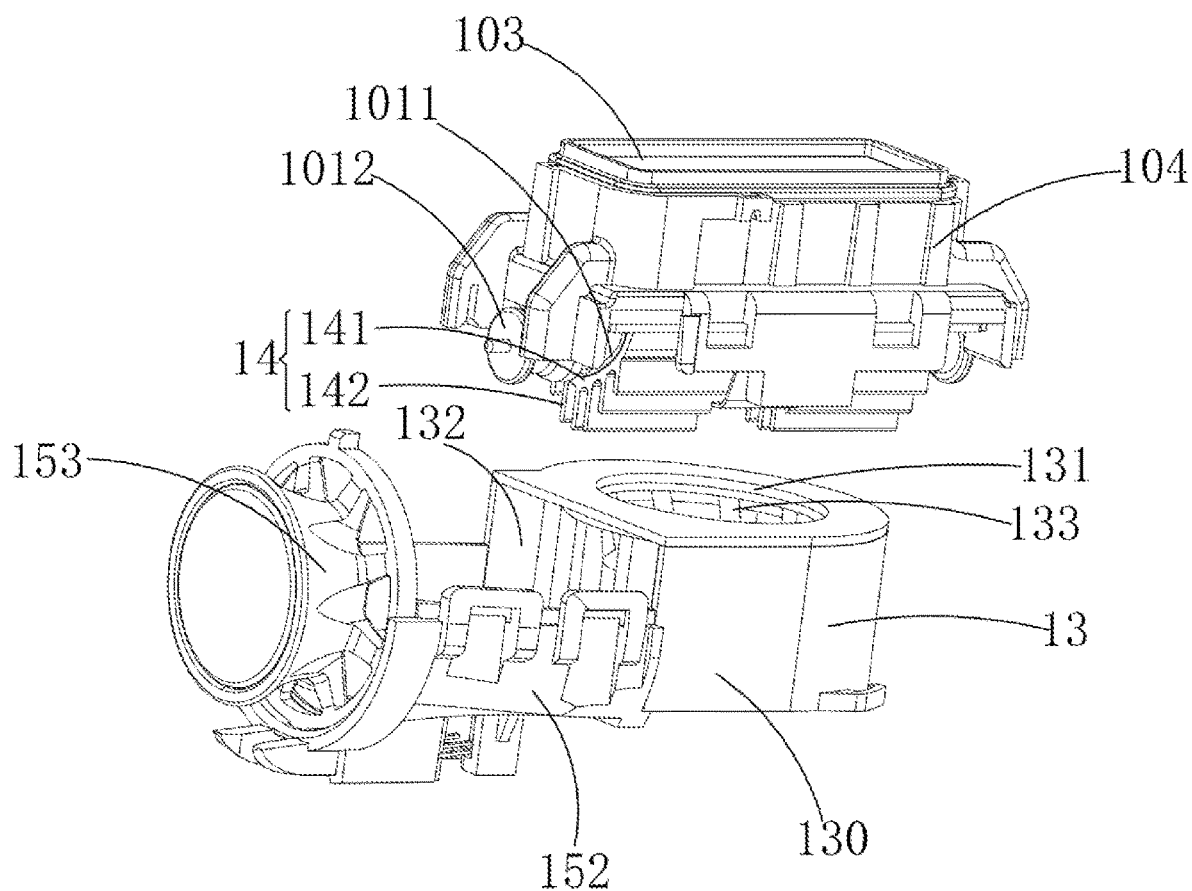
FIG. 7 is a partial perspective view 4 of the portable hair-removal apparatus according to the first embodiment.
Figure 8:
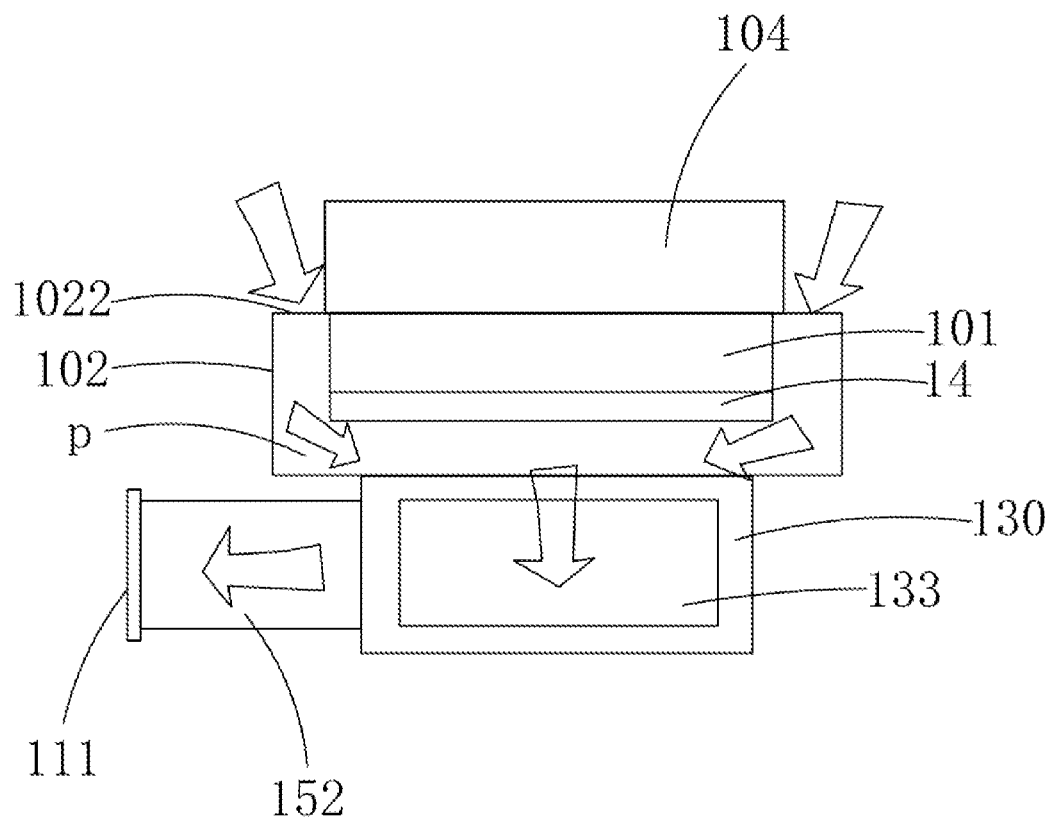
FIG. 8 is a schematic diagram of the direction of the internal air duct of the portable hair-removal apparatus according to the first embodiment. the first embodiment.

Referring to FIGS. 6-7, the portable hair-removal apparatus 1 further includes an aluminum capacitor 17 and a key assembly 16. The key assembly 16 is electrically connected to the circuit-board assembly 18. The circuit-board assembly 18 and the aluminum capacitor 17 are electrically connected and are disposed on two opposite sides of the inner support 15. The inner support 15 is provided with a limiting mechanism 154, and the key assembly 16 is positioned in the limiting mechanism 154. The inner support 15 is mainly configured as a mounting carrier of the components inside the portable hair-removal apparatus 1. The fan housing 130 is embedded in the fan through hole 151 of the inner support 15, which further saves the internal space of the portable hair-removal apparatus 1, makes the internal structure thereof more compact, and improves the portability as well as the stability of the portable hair-removal apparatus 1. One end of the inner support 15 close to the fan housing 130 is provided with an air-exhaust pipeline 152. One end of the air-exhaust pipeline 152 is docked with the air-supply opening 132 to connect the fan housing 130. External air discharged from the air-supply opening 132 enters the air-exhaust pipeline 152 and is discharged from the air-exhaust opening 111 formed on the housing 11. The air-exhaust pipeline 152 plays a role in gathering and directionally discharging external air to be discharged, such that the air to be discharged rich in heat is prevented from escaping into the portable hair-removal apparatus 1 again to affect heat dissipation, and the heat dissipation efficiency of the portable hair-removal apparatus 1 is further improved. The other end of the air-exhaust pipeline 152 is provided with an air-outlet grille 153 disposed corresponding to the air-exhaust opening 111. The air-outlet grille 153 is mainly configured for preventing larger external objects from blocking the air-exhaust pipeline 152, which may affect the air exhausting of the air-exhaust pipeline 152. Meanwhile, the problem that the turbine fan 133 may be damaged due to the fact that external objects enter the fan housing 130 through the air-exhaust pipeline 152 is solved.

Optionally, the fan assembly 13 is disposed directly opposite to the heat-generating assembly 101, such that the fan assembly 13 can suck air more smoothly with respect to the heat-generating assembly 101, and the air suction and heat dissipation efficiency of the fan assembly 13 with respect to the heat-generating assembly 101 can be further improved.

Referring to FIGS. 1-8, the portable hair-removal apparatus 1 according to the first embodiment forms a complete short-range air-passing channel by means of sequentially communicating the air-entrance gap q, the air inlet 1022, the air-passing cavity p, the air outlet 1021, the fan assembly 13 and the air-exhaust opening 111. Compared with traditional hair-removal devices that need an additional air duct, the cost of the portable hair-removal apparatus 1 is lower, the internal structure is simplified, the volume is reduced, and the portability is improved. The portable hair-removal apparatus 1 rotates and sucks air through the fan assembly 13, such that external air is sucked via the air-entrance gap q. Then the external air enters the air-passing cavity p via the air inlet 1022 and flows through the heat-generating assembly 101 to reduce the temperature thereof. At this time, the external air takes away part of the heat of the heat-generating assembly 101 and is discharged via the air outlet 1021. Then the external air is sucked into the fan assembly 13 via the air-suction opening 131 provided on the fan assembly 13. Finally, the fan assembly 13 blows the external air from the air-supply opening 132 to the air-exhaust opening 111 of the housing 11, and the external air is discharged from the air-exhaust opening 111 to ambiance. As such, the heat of the heat-generating assembly 101 in the portable hair-removal apparatus 1 can be discharged timely by means of the air-guiding effect of the air-passing channel and the air suction effect of the fan assembly 13. Furthermore, the external air sucked by the air-entrance gap q is blown in the direction of the inner wall of the heat-dissipation cover 12, such that the heat on the heat-dissipation cover 12 is taken away timely by the continuous airflow. Therefore, the temperature of the heat-dissipation cover 12 tends to be stable and does not overheat, which solves the problem of discomfort caused by the skin of the user being in contact with the overheated heat-dissipation cover 12, and effectively optimizes the hair removal experience. Understandably, the complete short-range air-passing channel in the portable hair-removal apparatus 1 enables the heat in each component inside the portable hair-removal apparatus 1 can be dissipated timely, which further improves the heat dissipation performance thereof, such that the durability and safety of the portable hair-removal apparatus 1 are greatly improved, and the portable hair-removal apparatus 1 is more convenient to use. Additionally, since the heat dissipation performance of the portable hair-removal apparatus 1 is improved, the working temperature of the portable hair-removal apparatus 1 can be reduced, and the user experience will not be affected when using the portable hair-removal apparatus 1.

As a variant embodiment, the heat-dissipation cover 12 and the housing 11 are integrally formed. The heat-dissipation cover 12 and/or the housing 11 are provided with an air-inlet through hole communicated with the air-passing cavity p via the air inlet 1022. External air is sequentially sucked into the air-passing cavity p through the air-inlet through hole and the air inlet 1022. The position of the air-inlet through hole can be flexibly arranged according to actual requirements, as long as the air-inlet through hole is communicated with the air-passing cavity p. This design has the advantage of flexibility. The manufacturer can adjust the position and shape of the air-inlet through hole according to the requirements of customers to meet the aesthetics of different customers.

In conclusion, the heat-dissipation cover 12 in the portable hair-removal apparatus 1 protrudes out of the housing 11, and the outer structure of the entire portable hair-removal apparatus 1 except the slightly convex heat-dissipation cover 12 is an elongated rod-shaped structure, such that the portable hair-removal apparatus 1 is more convenient to hold compared with traditional hair-removal apparatuses. A user can select a contact portion between the palm and the portable hair-removal apparatus 1 within a large range, which makes the operation thereof convenient. Since the portable hair-removal apparatus 1 is of an elongated rod-shaped structure, the portable hair-removal apparatus 1 can be placed in a narrow space, and people can conveniently place the portable hair-removal apparatus 1 on a narrow container (such as a bag or a handbag) that they carry with them when going out, which further improves the portability of the portable hair-removal apparatus 1. The rod-shaped structure enables the overall strength of the portable hair-removal apparatus 1 to be greatly improved, such that the portable hair-removal apparatus 1 is less prone to damage compared with hair-removal apparatuses with other shapes.

The invention claimed is:

1. A portable hair-removal apparatus, comprising:
an air-suction mechanism;
wherein the air-suction mechanism comprises a beat-generating assembly and a beat-dissipation housing;
wherein the heat-dissipation housing is provided with an air outlet, and the heat-generating assembly is connected to the heat-dissipation housing to define at least one air inlet;
the air-suction mechanism draws external air into the heat-dissipation housing through the air inlet, drives the external air flow through the heat-generating assembly to reduce the temperature thereof, and being discharged-discharges the external air through the air outlet;
wherein the air-suction mechanism comprises a light-filter head assembly and a light-filter head housing;
wherein the light-filter head assembly comprises a light-filter head, a light-filter lens and an annular light-shield sheet; the light-filter head being accommodated in the light-filter head housing, the light-filter lens being compactly attached to the light-filter head, and the light-shield sheet being disposed between the light-filter lens and the heat-generating assembly.

2. The portable hair-removal apparatus according to claim 1, wherein the at least one air inlet comprises at least two air inlets, and two of the air inlets are disposed at two opposite ends of the heat-generating assembly.

3. The portable hair-removal apparatus according to claim 2, wherein a gap is reserved between two ends of the heat-generating assembly and a side wall of the heat-dissipation housing to define the air inlet.

4. The portable hair-removal apparatus according to claim 1, wherein the portable hair-removal apparatus does not comprise a refrigeration assembly for refrigerating and contacting with skin.

5. The portable hair-removal apparatus according to claim 1, wherein the air outlet is disposed on a middle position of one side of the heat-dissipation housing away from the heat-generating assembly
the heat-dissipation housing and the heat-generating assembly defining an air-passing cavity, and the air-suction mechanism draws external air from the air inlet flowing in the air-passing cavity to take away heat of the heat-generating assembly and flowing out through the air outlet.

6. The portable hair-removal apparatus according to claim 5, further comprising:
a housing connected to the heat-dissipation housing; and
a heat-dissipation cover;
the heat-dissipation cover is clamped with the light-filter head housing; wherein an annular air-entrance gap is formed between the heat-dissipation cover and the housing, the air-entrance gap is communicated with the air-passing cavity the air inlet, and external air is sucked into the air-passing cavity sequentially through the air-entrance gap and the air inlet.

7. The portable hair-removal apparatus according to claim 5, further comprising:
a housing connected to the heat-dissipation housing; and
a heat-dissipation cover integrally formed with the housing;
wherein an air-inlet through hole is provided on the heat-dissipation cover and/or on the housing, the air-inlet through hole is communicated with the air-passing cavity the air inlet, and the air-suction mechanism draws the external air into the air-passing cavity sequentially through the air-inlet through hole and the air inlet.

8. The portable hair-removal apparatus according to claim 1, wherein the annular light-shield sheet is made of polytetrafluoroethylene.

9. The portable hair-removal apparatus according to claim 1, further comprising a fan assembly, wherein the fan assembly includes an air-suction opening and an air-supply opening; the housing being provided with an air-exhaust opening; the air-suction opening being in communication with the air outlet, and the air-supply opening being in communication with the air-exhaust opening.

10. The portable hair-removal apparatus according to claim 9, wherein the fan assembly is disposed directly opposite to the heat-generating assembly.

11. The portable hair-removal apparatus according to claim 9, further comprising a circuit-board assembly and an inner support;
wherein the inner support is provided with a fan through hole, and the fan assembly is accommodated therein;
the circuit-board assembly being disposed on the inner support and defining a limiting hole corresponding to the fan through hole;
one end of the air-suction mechanism provided with the air outlet passing through the limiting hole and being docked with the fan through hole to communicate with the fan assembly.

12. The portable hair-removal apparatus according to claim 11, further comprising an aluminum capacitor and a key assembly electrically connected to the circuit-board assembly, wherein the circuit-board assembly is electrically connected to the aluminum capacitor and the circuit-board assembly and the aluminum capacitor are disposed on two opposite sides of the inner support;
the inner support is provided with a limiting mechanism, and the key assembly is positioned therein.

13. The portable hair-removal apparatus according to claim 1, wherein the heat-generating assembly comprises a lamp tube and a reflective cup, and the lamp tube is disposed in the reflective cup in a penetrating manner.

14. The portable hair-removal apparatus according to claim 13, wherein a heat sink is provided corresponding to the reflective cup, and the heat sink is disposed between the reflective cup and the air outlet.

15. The portable hair-removal apparatus according to claim 14, wherein the heat sink comprises at least two sheet-shaped protrusions and an attaching portion attached to the reflective cup; the sheet-shaped protrusions being arranged on the attaching portion in a spaced manner and every two of the sheet-shaped protrusions defining an air-passing gap.

* * * * *